US007663412B1

(12) United States Patent
Farjadrad

(10) Patent No.: US 7,663,412 B1
(45) Date of Patent: Feb. 16, 2010

(54) METHOD AND APPARATUS FOR PROVIDING LEAKAGE CURRENT COMPENSATION IN ELECTRICAL CIRCUITS

(75) Inventor: Ramin Farjadrad, Mt. View, CA (US)

(73) Assignee: Aquantia Corporation, Milpitas, CA (US)

( * ) Notice: Subject to any disclaimer, the term of this patent is extended or adjusted under 35 U.S.C. 154(b) by 0 days.

(21) Appl. No.: 11/451,220

(22) Filed: Jun. 12, 2006

Related U.S. Application Data

(60) Provisional application No. 60/689,501, filed on Jun. 10, 2005.

(51) Int. Cl.
*G05F 3/20* (2006.01)
*H03K 17/60* (2006.01)
*H03K 17/687* (2006.01)

(52) U.S. Cl. ....................... 327/108; 327/543; 327/581; 323/315

(58) Field of Classification Search ....................... None
See application file for complete search history.

(56) References Cited

U.S. PATENT DOCUMENTS 5,077,491 A * 12/1991 Heck et al. .................... 327/83
6,191,641 B1 * 2/2001 Devanney .................... 327/525
6,433,528 B1 * 8/2002 Bonelli et al. ............... 323/315
6,600,303 B2 * 7/2003 Ikehashi ...................... 323/315
6,650,164 B2 * 11/2003 Kondo ......................... 327/309
6,831,505 B2 * 12/2004 Ozoe ........................... 327/541
6,876,251 B2 * 4/2005 Watanabe .................... 327/541
7,248,099 B2 * 7/2007 Kedilaya et al. ............ 327/539

* cited by examiner

*Primary Examiner*—Lincoln Donovan
*Assistant Examiner*—Terry L Englund
(74) *Attorney, Agent, or Firm*—Sawyer Law Group, P.C.

(57) ABSTRACT

A circuit is provided that (in one implementation) includes a first transistor having a first drain terminal, first gate terminal, and a first source terminal. The first drain terminal is connected to the first gate terminal, the first source terminal is connected to a first voltage. The circuit further includes a second transistor having a second drain terminal, second gate terminal, and a second source terminal. The second gate terminal is connected to both the first gate terminal and the first drain terminal, and the second source terminal is connected to the first voltage. The circuit further includes a third transistor having a third drain terminal, a third gate terminal, and a third source terminal. The third drain terminal is connected to the first drain terminal, and the third source terminal is connected to both the third gate terminal and a second voltage that is lower than the first voltage.

12 Claims, 2 Drawing Sheets

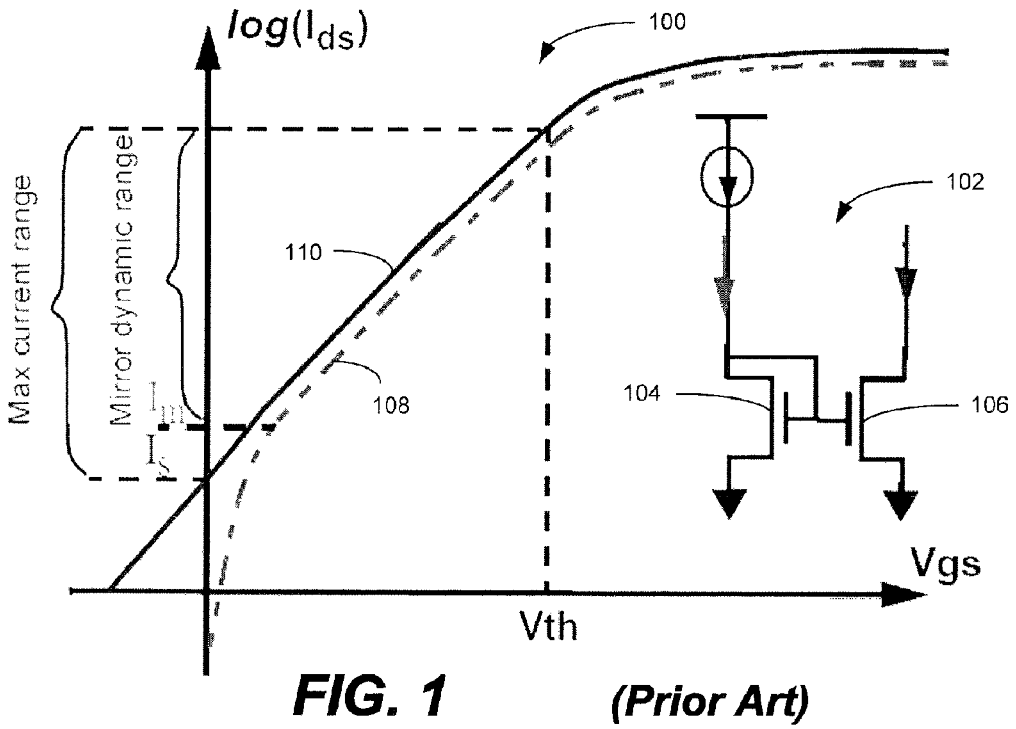
FIG. 1 (Prior Art)
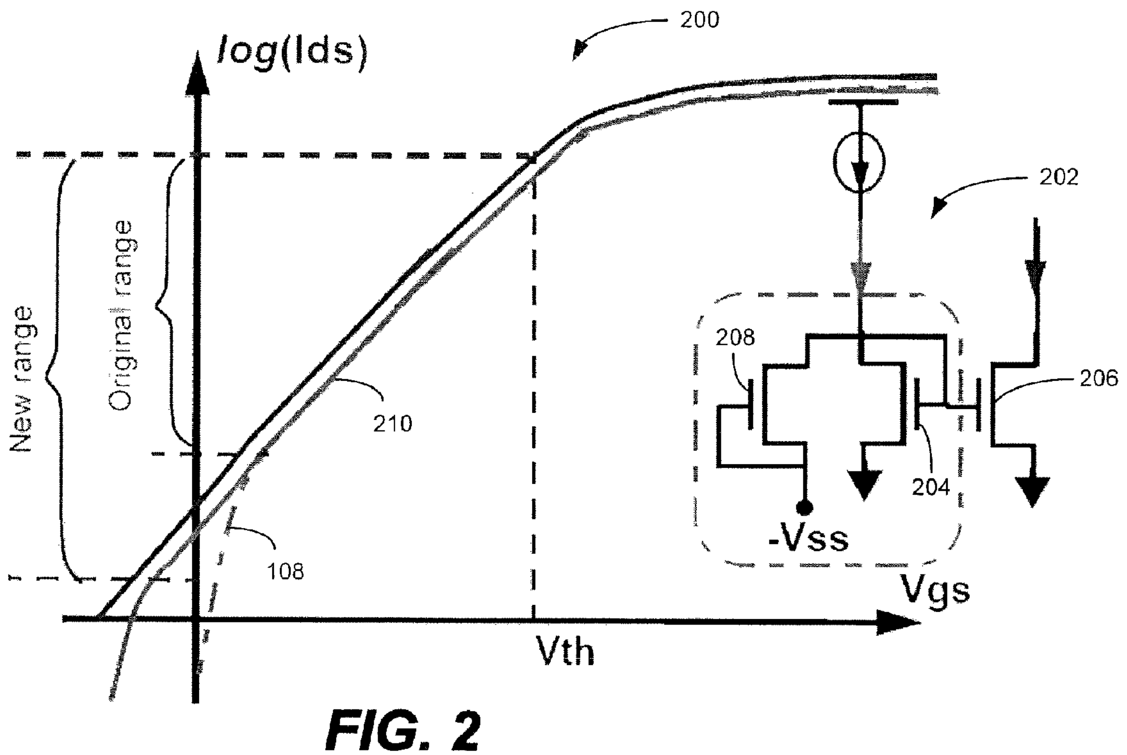
FIG. 2

METHOD AND APPARATUS FOR PROVIDING LEAKAGE CURRENT COMPENSATION IN ELECTRICAL CIRCUITS

CROSS-REFERENCE TO RELATED APPLICATIONS

This application claims benefit under 35 USC 119(e) of Provisional Application No. 60/689,501, filed on Jun. 10, 2005.

FIELD OF THE INVENTION

The present invention relates generally to electrical circuits, and more particularly to techniques for providing leakage current compensation for electrical circuits operating in the subthreshold operating region.

BACKGROUND OF THE INVENTION

Current mirrors are among the most commonly used circuit topologies in electrical circuits and, consequently, a large variety of current mirroring techniques exists to improve current mirroring quality. However, conventional techniques for current mirroring typically address only current mirror performance in the normal operating region of transistors (associated with a current mirror) and not in the subthreshold operating region. Subthreshold operation of circuits has attracted considerable attention recently due to a strong push for low power integrated circuits, as the complexity of such low power integrated circuits grows exponentially.

BRIEF SUMMARY OF THE INVENTION

In general, in one aspect, this specification describes a current mirror circuit including a first transistor having a first drain terminal, first gate terminal, and a first source terminal. The first drain terminal is connected to the first gate terminal, and the first source terminal is connected to a first voltage. The current mirror circuit further includes a second transistor to mirror a current associated with the first transistor. The second transistor includes a second drain terminal, second gate terminal, and a second source terminal. The second gate terminal is connected to both the first gate terminal and the first drain terminal, and the second source terminal is connected to the first voltage. The current mirror circuit further includes a third transistor having a third drain terminal, a third gate terminal, and a third source terminal. The third transistor is connected with the first transistor such that the third drain terminal is connected to the first drain terminal. The third source terminal is connected to both the third gate terminal and a second voltage that is lower than the first voltage.

Implementations may include one or more of the following features. The first power supply voltage may be substantially zero and the second power supply voltage may be a negative voltage. Alternatively, the first power supply voltage may be above zero and the second power supply voltage may be substantially zero. Each transistor of the set of the first transistor, the second transistor, and the third transistor may be of the same type such that each is an NMOS transistor, a PMOS transistor, or a bipolar junction transistor (BJT).

In general, in another aspect, this specification describes a circuit including a first transistor having a first drain terminal, first gate terminal, and a first source terminal. The first drain terminal is connected to the first gate terminal, and the first source terminal is connected to a first voltage. The circuit further includes a second transistor having a second drain terminal, a second gate terminal, and a second source terminal. The second transistor is connected with the first transistor such that the second drain terminal is connected to the first drain terminal, and the second source terminal is connected to both the second gate terminal and a second voltage that is lower than the first voltage.

Implementations can include one or more of the following features. The circuit can comprise a translinear circuit selected from the group consisting of a Gilbert multiplier cell or a common-source or common-emitter differential pair stage.

In general, in another aspect, this specification describes a current mirror circuit comprising a first transistor to receive an input current. The first transistor has a terminal that is coupled to a first low voltage. The current mirror circuit further includes a second transistor to mirror the input current received by the first transistor. The second transistor is coupled to the first transistor and has a terminal that is coupled to the first low voltage. The current mirror circuit further includes a third transistor with the first transistor. The third transistor has a terminal that is coupled to a second low voltage, in which the second low voltage has a lower voltage relative to the first low voltage.

Implementations can provide one or more of the following advantages. In one implementation, the proposed technique of an addition of an off-device to a current mirror can extend the effective dynamic range (or accuracy range) of the current mirror to very low current levels, even below the device channel leakage. As a result, this technique can achieve a given target requirement with minimal complexity, area, power and/or headroom requirements. Also, there is no degradation in the current mirroring speed of the current mirror, other than the extra diffusion capacitance of the off-device that minimally increases the current mirror RC time constant. The proposed technique is not limited to a basic current mirror structure, and can be widely applied to other circuit topologies as well—e.g., translinear circuit topologies.

The details of one or more implementations are set forth in the accompanying drawings and the description below. Other features and advantages will be apparent from the description and drawings.

BRIEF DESCRIPTION OF THE DRAWINGS

FIG. 1 illustrates a current-voltage (I-V) graph associated with a conventional two-transistor current mirror.

FIG. 2 illustrates a current-voltage (I-V) graph associated with a current mirror including and off-device in accordance with one implementation.

Like reference symbols in the various drawings indicate like elements.

DETAILED DESCRIPTION OF THE INVENTION

Figure 3:
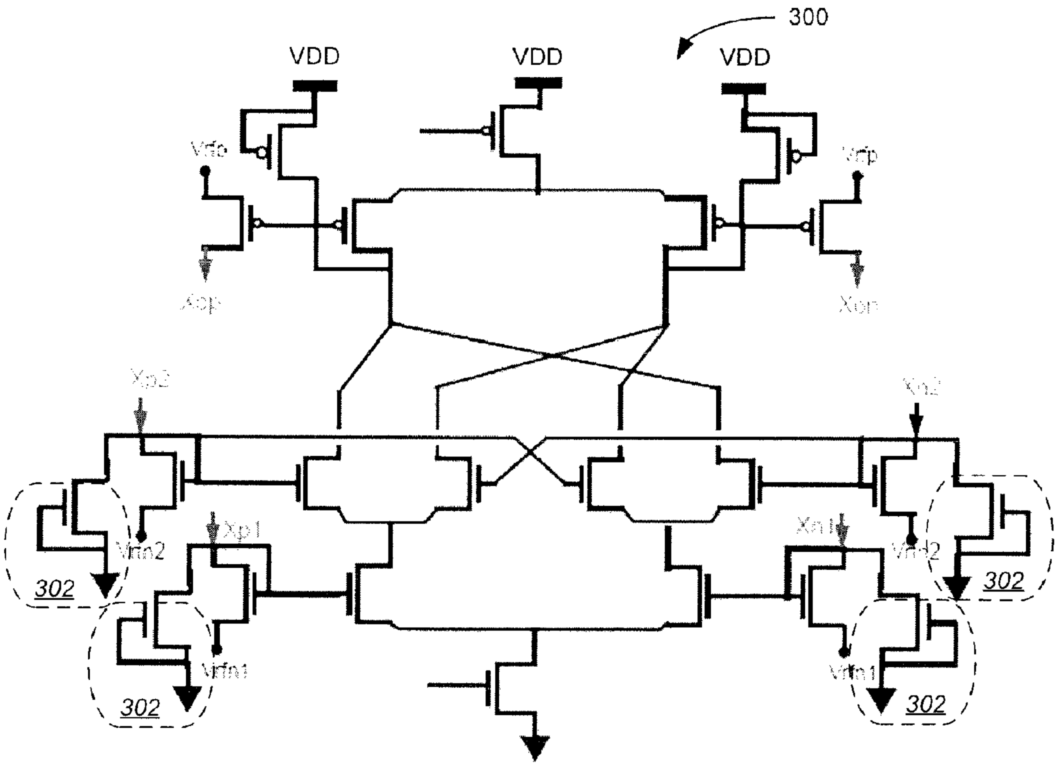
FIG. 3 illustrates a Gilbert multiplier cell including a plurality of off-devices in accordance with one implementation.

The present invention relates generally to electrical circuits, and more particularly to techniques for providing leakage current compensation for electrical circuits operating in the subthreshold operating region. The following description is presented to enable one of ordinary skill in the art to make and use the invention and is provided in the context of a patent application and its requirements. Various modifications to implementations and the generic principles and features described herein will be readily apparent to those skilled in the art. Thus, the present invention is not intended to be limited to the implementations shown but is to be accorded the widest scope consistent with the principles and features described herein.

A problem associated with operating a transistor in the subthreshold operating region is that current signal amplitudes can be in the same order of magnitude as leakage currents. In CMOS (Complimentary Metal-Oxide Semiconductor) circuits, channel leakage is generally the dominant source of leakage for low threshold voltage (Vth) devices, especially at high temperatures. As a result, the accuracy of a current mirror can be significantly affected at very low current levels that are of the same order of magnitude as the channel leakage current, as shown in FIG. 1. In particular, FIG. 1 shows an I-V graph 100 associated with a conventional (NMOS) current mirror 102, including an input transistor 104 and an output transistor 106. The drain terminal of the input transistor 106 is connected to a diode (e.g., another transistor). The dotted line 108 represents the Ids-Vds curve associated with the input transistor 104, and the solid line 110 represents the Ids-Vds curve associated with the output transistor 106.

Within the subthreshold operating region—i.e., below the threshold voltage Vth-Ids follows the following equation:

$$I_{ds}=I_s e^{(Vgs/nUt)}(1-e^{(-Vds/nUt)}), \quad \text{(eq. 1)}$$

where Is is proportional to device W/L (width to length ratio) and is exponentially dependent on device threshold voltage. Ut is equal to KT/q (where K is the Boltzmann constant, T is temperature in Kelvin, and q is electron charge). Factor n is a unitless constant that varies with process and is typically around 1.40. It can be shown that a maximum value for nUt occurs at a high temperature of T=400° K., and is around 45 mV. Thus, as long as the Vds of the output transistor 106 is above approximately 200 mV, the output current (Iout) through the output transistor 106 is substantially only a function of Vgs, and, therefore, the output current is as follows:

$$I_{out}=I_s e^{(Vgs/nUt)}. \quad \text{(eq. 2)}$$

As a result, the minimum output current of the output transistor 106 cannot be less than Is. However, for the input transistor 104, because Vgs=Vds, the input current (Iin) is given by the following equation:

$$Ii_n=I_s e^{(Vgs/nUt)}-I_s, \quad \text{(eq. 3)}$$

where the input current (Iin) goes to zero as Vgs goes to zero. Therefore, as the input current flowing into the input transistor 104 is reduced to zero, as shown in FIG. 1, the I-V curve associated with the input transistor 104 (i.e., the dotted line 108) deviates from the ideal exponential equation and results in the non-linearity. This deviation from the ideal exponential equation causes the current mirror 102 to produce an inaccurate output current at very low input currents. Consequently, the bottom range of the current mirror 102 is limited to a larger current value (Im) relative to Is due to mirroring accuracy.

Equations 2 and 3 above can be combined and reduced to the following simple input-output current transfer equation:

$$I_{out}=Ii_n+I_s, \quad \text{(eq. 4)}$$

where for a mirroring accuracy of better than 10%, the minimum input current (Iin) must be at least ten times larger than Is, which effectively limits the bottom range (Im) of the current mirror 102 to 10Is.

FIG. 2 illustrates an I V graph 200 associated with an (NMOS) current mirror 202. The current mirror 202 includes an input transistor 204 and an output transistor 206. The drain terminal of the input transistor 204 is connected to a diode (e.g., a transistor or other device including a diode). The current mirror 202 also includes an off device 208 that (in one implementation) is an NMOS transistor that is coupled in parallel to the input transistor 204—i.e., the drain terminal of the off device is connected to the drain terminal of the input transistor 204. The gate terminal of the off device 208 is shorted (or connected) to the source terminal of the off device 208, which source terminal is connected to a power supply (−Vss) having a lower voltage relative to the source terminal voltages of the input transistor 204 and output transistor 206. The off device provides current leakage compensation for the input transistor 204, and as a result of the off device 208 being coupled to the input transistor 204, the current (Icombo) that flows through the input transistor 204 and the off device 208 is given by the following equation:

$$I_{combo}=(I_s e^{(Vgs/nUt)}-I_s)+(I_s-I_s e^{(-(Vgs+Vss)/nUt)}), \quad \text{(eq. 5)}$$

which reduces to the following equation:

$$I_{combo}=I_s e^{(Vgs/nUt)}-I_s e^{(-(Vgs+Vss)/nUt)}. \quad \text{(eq. 6)}$$

Equation 6 shows that the error term in the I V equation of Icombo is Is divided by $e^{(Vgs+Vss)/nUt)}$, which can be significantly larger than unity if (Vgs+Vss)>>nUt. Therefore, the input output current transfer equation is given as follows:

$$I_{out}=Ii_n+I_s e^{(-(Vgs+Vss)/nUt)}. \quad \text{(eq. 7)}$$

Thus, as long as (Vgs+Vss) is greater than 200 mV, the error term in the input-output current transfer equation (eq. 7) is effectively divided by a factor of more than 100 and, therefore, the bottom range of the current mirror 202 is reduced by a factor of 100. Accordingly, the new dynamic range of the current mirror 202—i.e., the accuracy range of the current mirror 202—is extended down to Is/10 as shown in FIG. 2 by the solid line 210. In other words, the current mirror 202 can have an output current that is less than Is, as the Vgs of the output transistor 206 can become negative due to the off-device 208 being connected to a voltage (e.g., −Vss) that is lower than the source terminal of the output transistor 206. In one implementation, the voltage (−Vss) is substantially equal to zero and the source terminals of the input transistor 204 and the output transistor 206 are biased at a voltage above zero. In another implementation, the voltage (−Vss) is a negative voltage, and the source terminals of the input transistor 204 and the output transistor 206 are biased at zero (or ground).

FIG. 3 illustrates a differential Gilbert multiplier cell 300 including a plurality of off-devices 302, for accurate operation in the subthreshold operating region. In one implementation, instead of generating negative voltages, which may be impractical in some designs, the reference voltages Vrfn1, Vrfn2 are biased at a voltage above ground (and below the positive supply voltage VDD), and the source terminal of the off-devices 302 are biased at ground (or zero). Alternatively, the reference voltages Vrfn1, Vrfn2 can be biased at ground, and the source terminal of the off-devices 302 can be biased at a negative voltage.

Figure 4:
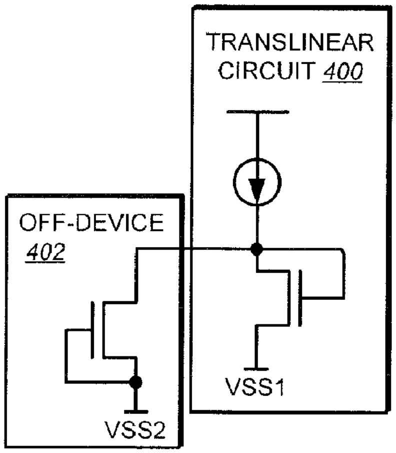
FIG. 4 illustrates a translinear circuit including an off-device in accordance with one implementation.

The technique of coupling an off device to a diode connected device of a current mirror (e.g., coupling the off device 208 to the (diode connected) input transistor 204 as shown in FIG. 2) can be applied generally to a diode connected device of a translinear circuit 400 as shown in FIG. 4. More specifically, FIG. 4 shows an off device 402 that is coupled to a diode connected device of the translinear circuit 400. In one implementation, the voltage D1 is higher than the voltage VDD2. Examples of translinear circuits include any common source or common emitter differential pair stage or a Gilbert multiplier cell with diode connected inputs where the transistor's I V curve is exponential.

Figure 5:
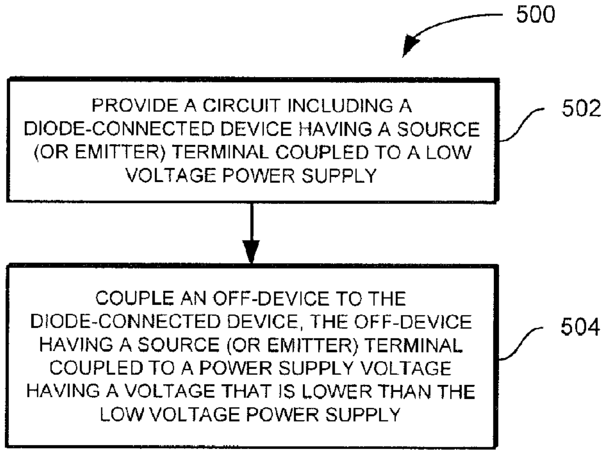
FIG. 5 illustrates a method for providing leakage current compensation in accordance with one implementation.

FIG. 5 illustrates a method 500 for providing leakage current compensation in a circuit in accordance with one implementation. A circuit (e.g., current mirror circuit 202 of FIG. 2) is provided that includes a diode connected device (e.g., input transistor 204) having a source terminal that is coupled to a low voltage (step 502). In one implementation, the diode connected device is a MOS (Metal Oxide Semiconductor) transistor. In another implementation, the diode connected device is a bipolar junction transistor (BJT) having an emitter terminal that is coupled to the low voltage. To provide current leakage compensation for the diode connected device while the diode connected device is operating in the subthreshold operating region, an off device (e.g., off device 208) is coupled to the diode connected device (step 504). Accordingly, in one implementation, the drain of the off device is connected to the drain of the diode connected device, and the source terminal of the off device is coupled to a voltage having a voltage that is lower than the low voltage (to which the source terminal of the diode connected device is coupled).

Various implementations have been described. Nevertheless, various modifications may be made to the implementations, and those modifications would be within the scope of the present invention. For example, though techniques described above generally described in the context of NMOS transistors, the techniques are also applicable to PMOS devices, as well as non-CMOS devices, such as bipolar junction transistor (BJTs) (e.g., a PNP transistor or an NPN transistor) in which the collector terminal, the base terminal, and the emitter terminal of a BJT correspond to the source terminal, gate terminal, and drain terminal of a CMOS device. For example, in one implementation, the techniques described above are applicable to BJTs that have substantially the same forward and reverse current gain—i.e., the BJT is built symmetrical—as opposed to FET/CMOS devices. In addition, although the source terminals of the transistors are depicted as being directly connected to a low power voltage supply rail (e.g., Vrfn1, Vrfn2, –Vss), the source terminals can be indirectly coupled to a corresponding low power voltage supply rail through a resistor or rectifier. Accordingly, many modifications may be made without departing from the scope of the present invention.

What is claimed is:

1. A current mirror circuit having subthreshold current compensation comprising:

a first transistor having a first drain terminal, first gate terminal, and a first source terminal, the first drain terminal being connected to the first gate terminal, the first source terminal being connected to a first voltage;

a second transistor to mirror a current associated with the first transistor, the second transistor having a second drain terminal, second gate terminal, and a second source terminal, the second gate terminal being connected to both the first gate terminal and the first drain terminal, the second source terminal being connected to the first voltage; and a third transistor having a third drain terminal, a third gate terminal, and a third source terminal, the third transistor being connected with the first transistor such that the third drain terminal is connected to the first drain terminal, the third source terminal being connected to both the third gate terminal and a second voltage that is lower than the first voltage, wherein the first transistor, the second transistor, and the third transistor are all of a common transistor type of one of an NMOS and PMOS type.

2. The current mirror circuit of claim 1, wherein the first voltage is substantially zero and the second voltage is a negative voltage.

3. The current mirror circuit of claim 1, wherein the first voltage is above zero and the second voltage is substantially zero.

4. A circuit having subthreshold current compensation comprising:

a first transistor having a first drain terminal, first gate terminal, and a first source terminal, the first drain terminal being connected to the first gate terminal, the first source terminal being connected to a first voltage; and a second transistor having a second drain terminal, a second gate terminal, and a second source terminal, the second transistor being connected with the first transistor such that the second drain terminal is connected to the first drain terminal, the second source terminal being connected to both the second gate terminal and a second voltage that is lower than the first voltage wherein the first transistor and the second transistor are all of a common transistor type of one of an NMOS and PMOS type.

5. The circuit of claim 4, wherein the circuit comprises a translinear circuit selected from the group consisting of a Gilbert multiplier cell or a common-source differential pair stage.

6. The circuit of claim 4, wherein the first voltage is substantially zero and the second voltage is a negative voltage.

7. The circuit of claim 4, wherein the first voltage is above zero and the second voltage is substantially zero.

8. A current mirror circuit having subthreshold current compensation comprising:

a first bipolar device having a first collector, first base, and a first emitter, the first collector being connected to the first base, the first emitter being connected to a first voltage;

a second bipolar device to mirror a current associated with the first bipolar device, the second bipolar device having a second collector, second base, and a second emitter, the second base being connected to both the first base and the first collector, the second emitter being connected to the first voltage; and a third bipolar device having a third collector, a third base, and a third emitter, the third bipolar device being connected with the first bipolar device such that the third collector is connected to the first collector, the third emitter being connected to both the third base and a second voltage that is lower than the first voltage wherein the first bipolar device, the second bipolar device, and the third bipolar device are all of a common bipolar device type.

9. The circuit of claim 8, wherein each of the first bipolar device and the second bipolar device comprises a PNP transistor.

10. The circuit of claim 8, wherein all of the first bipolar device, the second bipolar device, and the third bipolar device are a PNP transistor.

11. The circuit of claim 8, wherein each of the first bipolar device and the second bipolar device comprises an NPN transistor.

12. The circuit of claim 8, wherein all of the first bipolar device, the second bipolar device, and the third bipolar device are an NPN transistor.

* * * * *